(12) United States Patent
Som et al.

(10) Patent No.: US 11,417,644 B2
(45) Date of Patent: Aug. 16, 2022

(54) INTEGRATION OF MULTIPLE DISCRETE GAN DEVICES

(71) Applicant: MACOM Technology Solutions Holdings, Inc., Lowell, MA (US)

(72) Inventors: Shamit Som, Chelmsford, NH (US); John Stephen Atherton, Acton, MA (US); Wayne Mack Struble, Franklin, MA (US); Jason Matthew Barrett, Amherst, NH (US); Nishant R Yamujala, Somerville, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 155 days.

(21) Appl. No.: 16/903,961

(22) Filed: Jun. 17, 2020

(65) Prior Publication Data
US 2021/0398971 A1 Dec. 23, 2021

(51) Int. Cl.
*H01L 27/06* (2006.01)
*H01L 23/522* (2006.01)
(Continued)

(52) U.S. Cl.
CPC ...... *H01L 27/0617* (2013.01); *H01L 23/5226* (2013.01); *H01L 23/5286* (2013.01); *H01L 29/1608* (2013.01); *H01L 29/2003* (2013.01)

(58) Field of Classification Search
CPC ............. H01L 27/0617; H01L 23/5226; H01L 23/5286; H01L 29/1608; H01L 29/2003;
(Continued)

(56) References Cited

U.S. PATENT DOCUMENTS 5,432,371 A 7/1995 Denner et al.
10,325,833 B1 6/2019 Kanawati et al.
(Continued)

FOREIGN PATENT DOCUMENTS

EP 2339746 A1 6/2011

OTHER PUBLICATIONS

International Search Report and Written Opinion for PCT/US2021/028740 dated Jul. 6, 2021.

*Primary Examiner* — Jonathan Han
(74) *Attorney, Agent, or Firm* — Perilla Knox & Hildebrandt LLP; Jason M. Perilla

(57) ABSTRACT

Examples of integrated semiconductor devices are described. In one example, an integrated device includes first and second transistors formed on a substrate, where the transistors share a terminal metal feature to reduce a size of the integrated device. The terminal metal feature can include a shared source electrode metalization, for example, although other electrode metalizations can be shared. In other aspects, a first width of a gate of the first transistor can be greater than a second width of a gate of the second transistor, and the shared metalization can taper from the first width to the second width. The integrated device can also include a metal ground plane on a backside of the substrate, and the terminal metal feature can also include an in-source via for the shared source electrode metalization. The in-source via can electrically couple the shared source electrode metalization to the metal ground plane.

20 Claims, 6 Drawing Sheets

(51) Int. Cl.
*H01L 23/528* (2006.01)
*H01L 29/16* (2006.01)
*H01L 29/20* (2006.01)

(58) Field of Classification Search
CPC ............ H01L 23/4824; H01L 21/8252; H01L 27/0605; H01L 29/778; H01L 21/823475; H01L 29/41758; H01L 23/481; H01L 27/0207; H01L 29/4175; H01L 27/085; H03F 3/195; H03F 2200/451; H03F 1/0288
See application file for complete search history.

(56) References Cited

U.S. PATENT DOCUMENTS

| | | | |
|---|---|---|---|
| 2007/0146079 A1* | 6/2007 | Arnborg | H03F 1/0288 330/307 |
| 2008/0169474 A1 | 7/2008 | Sheppard | |
| 2016/0043643 A1* | 2/2016 | Ujita | H01L 27/088 257/392 |
| 2018/0350981 A1* | 12/2018 | Birner | H01L 23/481 |
| 2019/0028065 A1* | 1/2019 | Mahon | H01L 29/42324 |

* cited by examiner

INTEGRATION OF MULTIPLE DISCRETE GAN DEVICES

BACKGROUND

Individual semiconductor devices can be formed separately and packaged discretely, or a number of semiconductor devices can be formed on the same substrate and packaged together. Examples of active semiconductor devices include field effect transistors (FETs), junction field effect transistors (JFETs), high-electron-mobility transistors (HEMTs), bipolar junction transistors (BJTs), composite transistors, unidirectional and bi-directional silicon controlled rectifiers (SCRs), and thyristors, among other active devices.

In general, a transistor is an active semiconductor device used to amplify or switch signals and electric power. A transistor typically includes three terminals for connections to external circuitry. A voltage or current applied to one terminal of the transistor directs and controls a flow of charge through another pair of terminals of the transistor. Because the extent of charge and power that passes through the transistor can be greater than the amount of power necessary to control it, a transistor can be said to amplify a signal. Today, some power transistors are packaged individually, but many power transistors, in various configurations, are formed together on the same substrate.

Transistors can be formed using a number of different semiconductor materials and semiconductor manufacturing processes. Example semiconductor materials include the group IV elemental semiconductor materials, including Silicon (Si) and Germanium (Ge), compounds thereof, and the group III elemental semiconductor materials, including Aluminum (Al), Gallium (Ga), and Indium (In), and compounds thereof. Semiconductor transistor amplifiers can be constructed from group III-V direct bandgap semiconductor technologies, in certain cases, as the higher bandgaps and electron mobility provided by those devices can lead to higher electron velocity and breakdown voltages, among other benefits.

SUMMARY

Examples of integrated semiconductor devices are described. An integrated semiconductor device includes a first transistor formed on a substrate and a second transistor formed on the substrate, wherein the first transistor and the second transistor share at least one terminal metal feature to reduce a size of the integrated semiconductor device. In one example, the at least one terminal metal feature comprises a shared source electrode metalization of the first transistor and the second transistor. In one aspect, a first width of a gate of the first transistor is greater than a second width of a gate of the second transistor, and the shared source electrode metalization comprises at least one metalization taper from a size of the first width to a size of the second width.

In other aspects, the device further includes a metal layer ground plane on a backside of the substrate. The at least one terminal metal feature further comprises an in-source via for the shared source electrode metalization, and the in-source via electrically couples the shared source electrode metalization of the first transistor and the second transistor to the metal layer ground plane.

In other aspects, the first transistor comprises a number of gate fingers, a number of drain electrodes, and a number of source electrodes. The gate fingers, drain electrodes, and source electrodes are interdigitated among each other. A gate-to-gate pitch of the first transistor is smaller than the gate-to-gate pitch of the second transistor in one example.

The first transistor and the second transistor can comprise power transistors in an amplifier. As one example, the first transistor can include a main power transistor in a Doherty amplifier, and the second transistor can include a peak power transistor in the Doherty amplifier, although the transistors can be relied upon in other types of amplifiers.

The substrate of the integrated semiconductor device can include at least one of silicon or silicon carbide, among other materials, and the integrated semiconductor device can include a gallium nitride semiconductor material layer formed over the substrate, among other semiconductor materials. In one example, the first transistor and the second transistor can include gallium nitride semiconductor material power transistors.

In another example, an integrated semiconductor device includes a first active device formed on a substrate, and a second active device formed on the substrate, wherein the first active device and the second active device share at least one terminal metal feature to reduce a size of the integrated semiconductor device. The at least one terminal metal feature includes a shared electrode metalization of the first active device and the second active device. A first width of an active junction of the first active device is greater than a second width of an active junction of the second active device, and the shared electrode metalization includes at least one metalization taper from a size of the first width to a size of the second width.

The integrated semiconductor device further includes a metal layer ground plane on a backside of the substrate. The at least one terminal metal feature can include an in-electrode via for the shared electrode metalization, and the in-electrode via electrically couples the shared electrode metalization of the first active device and the second active device to the metal layer ground plane. The first active device can include a number of gate fingers, a number of drain electrodes, and a number of source electrodes. The gate fingers, drain electrodes, and source electrodes are interdigitated among each other. A gate-to-gate pitch of the first active device is smaller than the gate-to-gate pitch of the second active device in one example.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments. In the drawings, like reference numerals designate like or corresponding, but not necessarily the same, elements throughout the several views.

DETAILED DESCRIPTION

Figure 1:
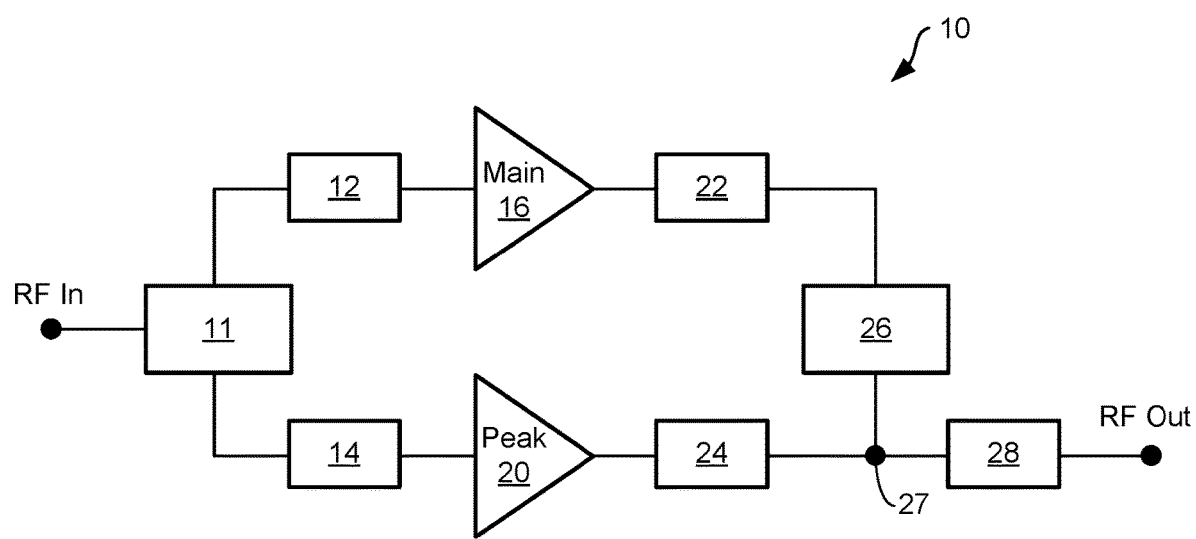
FIG. 1 illustrates an example amplifier according various embodiments described herein.

Among others, Gallium Nitride (GaN) semiconductor materials have received appreciable attention in recent years because of desirable electronic and electro-optical properties. GaN semiconductor materials have a wide, direct bandgap. A number of different active devices have been fabricated using GaN semiconductor materials. Because of the wide bandgap, GaN is more resistant to avalanche breakdown and can maintain electrical performance at higher temperatures than other semiconductors, such as silicon. GaN also has a higher carrier saturation velocity compared to silicon. Additionally, GaN has a Wurtzite crystal structure, is a very stable and hard material, has a high thermal conductivity, and has a much higher melting point than other conventional semiconductors such as silicon, germanium, and gallium arsenide. Thus, GaN semiconductor materials have been useful for manufacturing high-speed, high-voltage, and high-power active devices. For example, GaN materials are useful in semiconductor power amplifiers for radio frequency (RF) communications, radar, RF energy, and microwave applications.

Applications supporting mobile communications and wireless internet access, for example, can place high performance demands on high-speed RF amplifiers constructed from semiconductor transistors. The amplifiers may need to meet performance specifications related to output power, signal linearity, signal gain, bandwidth, and efficiency. One approach to amplifying signals for communications is to use a Doherty amplifier, although a number of different amplifier topologies are known.

For semiconductor transistor amplifiers, multiple transistors are often used in various stages of an amplifier design. The individual transistors in a single amplifier can vary in many characteristics as compared to each other, as the demands of each stage in the design may differ. For example, a standard Doherty power amplifier utilizes two transistors, a main or carrier transistor and an auxiliary or peaking transistor. The main transistor is typically designed to operate linearly and efficiently over a wide range of input powers and designed to dissipate a relatively large amount of power. The auxiliary transistor is designed to operate at relatively higher input powers and is designed to dissipate a relatively small amount of power. These differing requirements result in different transistor characteristic layouts between the main and auxiliary transistors in a Doherty power amplifier. For example, the main transistor may have a moderate or nominal periphery to operate well at lower power, while having a relatively larger gate pitch to present a better thermal environment for power dissipation. The auxiliary transistor, on the other hand, may have a relatively larger periphery for higher power, while having a relatively smaller gate pitch, as it does not need to dissipate very much power. Traditionally, different power transistors have been fabricated on different die, separately. The transistors are then assembled together into a common package.

In this context, the present disclosure relates to layout techniques and optimizations for active semiconductor devices. The concepts described herein are applicable to various types of field effect transistors, among other active semiconductor devices, formed using a number of different semiconductor processes and techniques. In some examples, the techniques and optimizations can be applied to group III-V direct bandgap active semiconductor devices, such as the III-Nitrides (Aluminum (Al)—, Gallium (Ga)—, Indium (In)—, and their alloys (AlGaIn) based Nitrides), Gallium Arsenide (GaAs), Indium Phosphide (InP), Indium Gallium Phosphide (InGaP), Aluminum Gallium Arsenide (AlGaAs), etc. devices, including high-electron mobility transistors (HEMTs), pseudomorphic high-electron mobility transistors (pHEMTs), and metamorphic high-electron mobility transistors (mHEMTs). However, the principles and concepts can be applied to transistors and other active devices formed from other semiconductor materials including but not limited to Si LDMOS.

As described herein, a number of different active devices, including power transistor devices of different design, can be formed and integrated together on a single substrate. The integration of the active devices is further optimized by sharing common elements among them, such as one or more terminal or electrode metalizations and/or via connections to a back-side ground plane of the integrated device. The integration of multiple transistors onto a single substrate or die reduces the total semiconductor area utilized for a given application, resulting in cost savings. The saving can be significant when the material cost is high, as is the case for GaN HEMT technologies. Additionally, the use of fewer die reduces handling and assembly costs, among other benefits.

In one example, an integrated device includes first and second transistors formed on a substrate, where the transistors share a terminal metal feature to reduce a size of the integrated device. The terminal metal feature can include a shared source electrode metalization, for example, although other electrode metalizations can be shared. In other aspects, a first width of a gate of the first transistor can be greater than a second width of a gate of the second transistor, and the shared metalization can taper from the first width to the second width. The integrated device can also include a metal ground plane on a backside of the substrate, and the terminal metal feature can also include an in-source via for the shared source electrode metalization. The in-source via can electrically couple the shared source electrode metalization to the metal ground plane. A number of other aspects and features of the embodiments are described in detail below with reference to the drawings.

FIG. 1 illustrates an example amplifier 10 according various embodiments described herein. The amplifier 10 comprises a Doherty amplifier, as described below. The amplifier 10 is described as a representative example of one type of amplifier that may incorporate the multi-device integration concepts described herein. Other types of amplifiers and other types of integrated circuits can rely upon the concepts, and the concepts are not limited to any particular type of amplifier or integrated circuit including a number of active semiconductor devices.

The amplifier 10 comprises a 90-degree power splitter 11, which divides a received RF input signal into two outputs that are coupled, respectively, to a main (or carrier) amplifier 16 and an auxiliary (or peaking) amplifier 20, arranged on parallel circuit branches. The power splitter 11 also delays (e.g., by approximately 90 degrees) the phase of the signal provided to the peaking amplifier 20 with respect to the phase of the signal provided to the main amplifier 13.

The amplifier 10 also includes impedance-matching components 12 and 14, which are coupled before the main amplifier 16 and peaking amplifier 20, respectively. The impedance-matching components match the impedances of the transmission lines from the power splitter 11 to the input impedances of the main amplifier 16 and the peaking amplifier 20, so that signal reflections are reduced.

Additional impedance-matching components 22 and 24 are coupled at the outputs of the main amplifier 16 and the peaking amplifier 20, to match impedances between the output of the main amplifier 16 to the input of an impedance inverter 26 and between the output of the peaking amplifier 20 to the combining node 27. The impedance inverter 26 rotates the phase of the signal output from the main amplifier 16, so that the signals from the main amplifier 16 and the peaking amplifier 20 will be substantially in phase at the combining node 27. As shown in FIG. 1, an output impedance-matching component 28 can also be coupled between the combining node 27 and an output of the amplifier 10, to match the output impedance of the amplifier 10 to an impedance of a load (not shown).

By design, the peaking amplifier 20 is typically off at lower power levels, which can be handled by the main amplifier 16 alone. At higher power levels, the main amplifier 16 can become saturated, and the gain of the main amplifier 16 can be compressed, resulting in a loss of linearity for the amplifier 10. The compression point for the main amplifier 16 can vary depending upon its design. When the peaking amplifier 20 is on, it effectively adds load impedance to the main amplifier 16 (reducing the gain of the main amplifier 16) but also assists in extending the linearity of amplification to higher power levels.

In a symmetric Doherty amplifier, the device characteristics of the main amplifier and the peaking amplifier may be substantially similar or identical according to design. For example, they may be the same type, same size, and configured to handle a same amount of signal power and amplify a signal by a same amount. Another approach is to use an asymmetrical Doherty amplifier. In this case, the main and peaking amplifiers may be of different type, different size, and configured to amplify a signal by different amounts or over different ranges. Particularly in asymmetrical Doherty amplifiers, the transistor(s) used for the main amplifier can be of different design than the transistor(s) used for the peaking amplifier. For example, the main transistor may have a moderate or nominal periphery to operate well at lower power (e.g., lower voltages), while having a relatively larger gate-to-gate pitch to present a better thermal environment for power dissipation. The auxiliary transistor, on the other hand, may have a relatively larger periphery for higher power (e.g., higher voltages), while having a relatively smaller gate-to-gate pitch, as it does not need to dissipate very much power. Traditionally, different power transistors have been fabricated on different substrates (e.g., semiconductor material wafers), separately. The transistors are then singulated, arranged, electrically connected, and assembled into a common package. The use of two different types of transistors, fabricated on different, separate substrates, is relatively common for many different types of power amplifiers and other circuit designs beyond Doherty amplifiers, particularly in designs using transistors capable of higher power.

Figure 2:
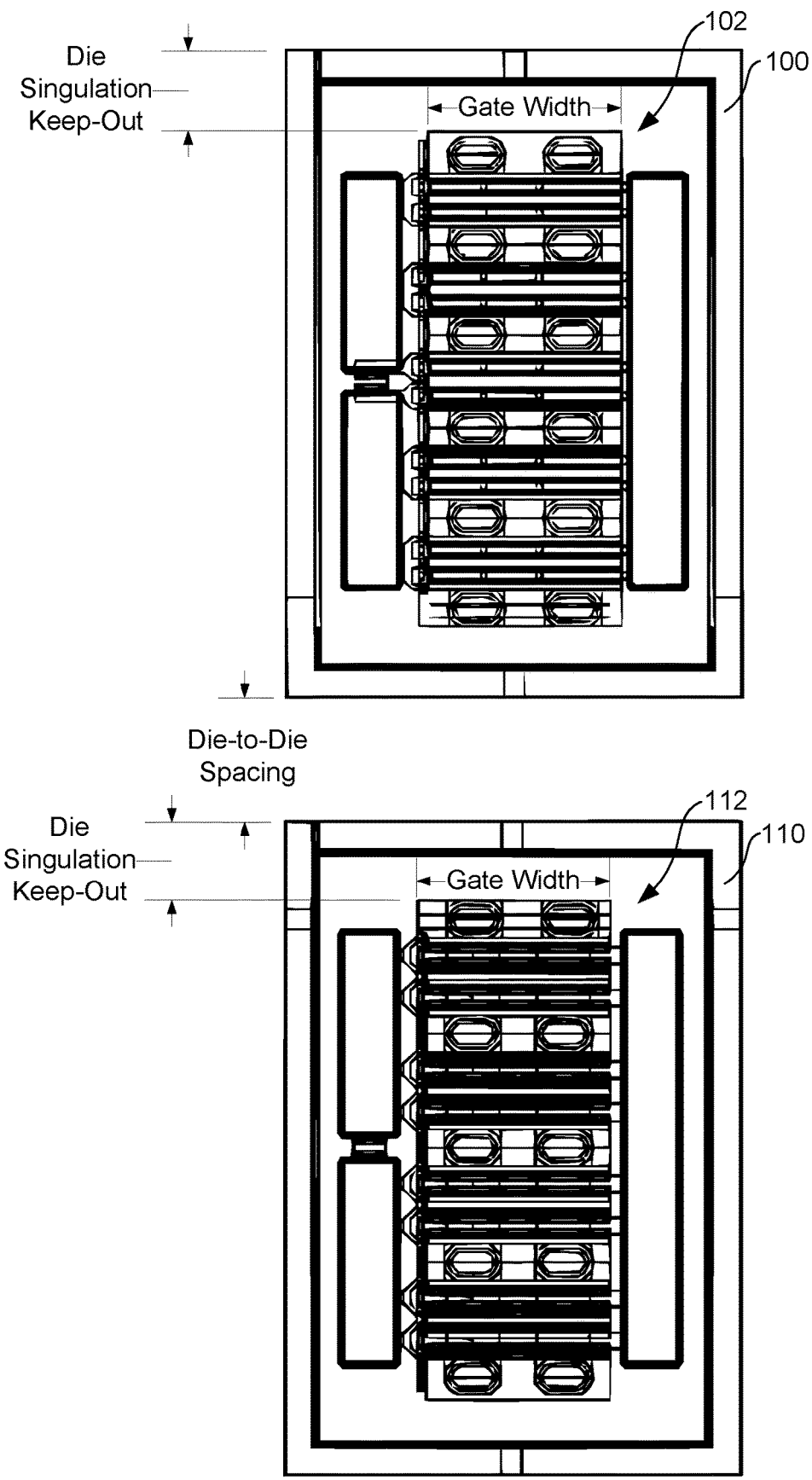
FIG. 2 illustrates a first die and a second die, including separate power transistors, for the amplifier shown in FIG. 1 according various embodiments described herein.

FIG. 2 illustrates a first die 100 and a second die 110, including separate power transistors, for the amplifier 10 shown in FIG. 1. Particularly, the first die 100 includes a transistor 102, and the second die 110 includes a transistor 112. The transistors 102 and 112 can be embodied as multi-finger planar field-effect transistors (FETs). The layout for multi-finger planar FETs consists of interdigitated gate, drain, and source terminals or electrodes as described in further detail below with reference to FIGS. 4-6.

In one example, the transistor 102 can be relied upon for the peaking amplifier 20 in the amplifier 10 shown in FIG. 1, and the transistor 112 can be relied upon for the main amplifier 16 in the amplifier 10. Among other differences, the transistor 112 can be formed to have a moderate or nominal periphery, while having a relatively larger gate-to-gate pitch than the transistor 102, to present a better thermal environment for power dissipation. The transistor 102, on the other hand, may have a relatively larger periphery, while having a relatively smaller gate-to-gate pitch, as it does not need to dissipate as much power. Due to those differences and other factors, the transistor 102 and the transistor 112 are fabricated on different substrates (e.g., semiconductor material wafers), separately. The die 100 and 110 are then singulated, arranged side-by-side as shown in FIG. 2, electrically connected (e.g., using bond wires, surface mount connections, etc.), and encapsulated into a common package.

The use of two different types of transistors fabricated on different substrates has a number of drawbacks. First, the practice results in a packaged device that is larger than it would otherwise be if the transistors 102 and 112 were formed on a common substrate. As shown in FIG. 2, automated assembly considerations, among other factors, may require a minimum spacing between the die 100 and the die 110 (i.e., the die-to-die spacing in FIG. 2). Additionally, the ability to separate or singulate the transistor 102 on the die 100 from its surrounding substrate, without damage, results in the need for an open clearance area around the transistor 102, shown in FIG. 2 as a die singulation keep-out area. Similarly, the ability to separate or singulate the transistor 112 on the die 110 from its surrounding substrate, without damage, results in the need for an open clearance area around the transistor 112. Thus, the practice of separately manufacturing the transistors 102 and 112, and assembling them together in a common package, results in a larger packaged device than if the transistors 102 and 112 were integrated together on a common substrate. Additionally, the practice leads to more unused semiconductor materials in the keep-out areas. This cost is particularly high for active devices formed using certain semiconductor materials, such as GaN HEMT technologies.

To address and overcome a number of the problems discussed above, FIG. 3 illustrates a single die 200, including two power transistors 202 and 212. The transistors 202 and 212 are formed and fabricated together on a common substrate in a certain manner as described below, to achieve a number of benefits. The die 200, including the transistors 202 and 212, is one representative example of the integration of a number of active devices on the same substrate, where the devices share at least one common feature. The particular features and aspects of the die 200 can be extended to use with other types and arrangements of active devices.

In one example, the transistors 202 and 212 can be formed as GaN-on-Silicon power transistors. The transistors 202 and 212 could also be formed as GaN-on-Silicon Carbide (GaN-on-SiC) transistors or GaN transistors formed on other suitable types of substrates. In other examples, the transistors 202 and 212 can be formed as other group III-Nitrides or group III-V direct bandgap active semiconductor devices (e.g., GaAs, InP, InGaP, AlGaAs, etc. devices). The devices can be formed as enhancement mode HEMT, pHEMT, or mHEMT devices. In other cases, the concepts described herein can be relied upon for use with depletion mode devices with certain design changes. The concepts are not limited to group III-V semiconductor devices, however, as the concepts can be applied to other semiconductor materials and processing technologies. Thus, while the concepts can be particularly beneficial for use with power transistors formed from GaN for amplifiers, the concepts can also be relied upon when forming other active devices using other semiconductor materials and processes for other types of circuits.

Figure 3:
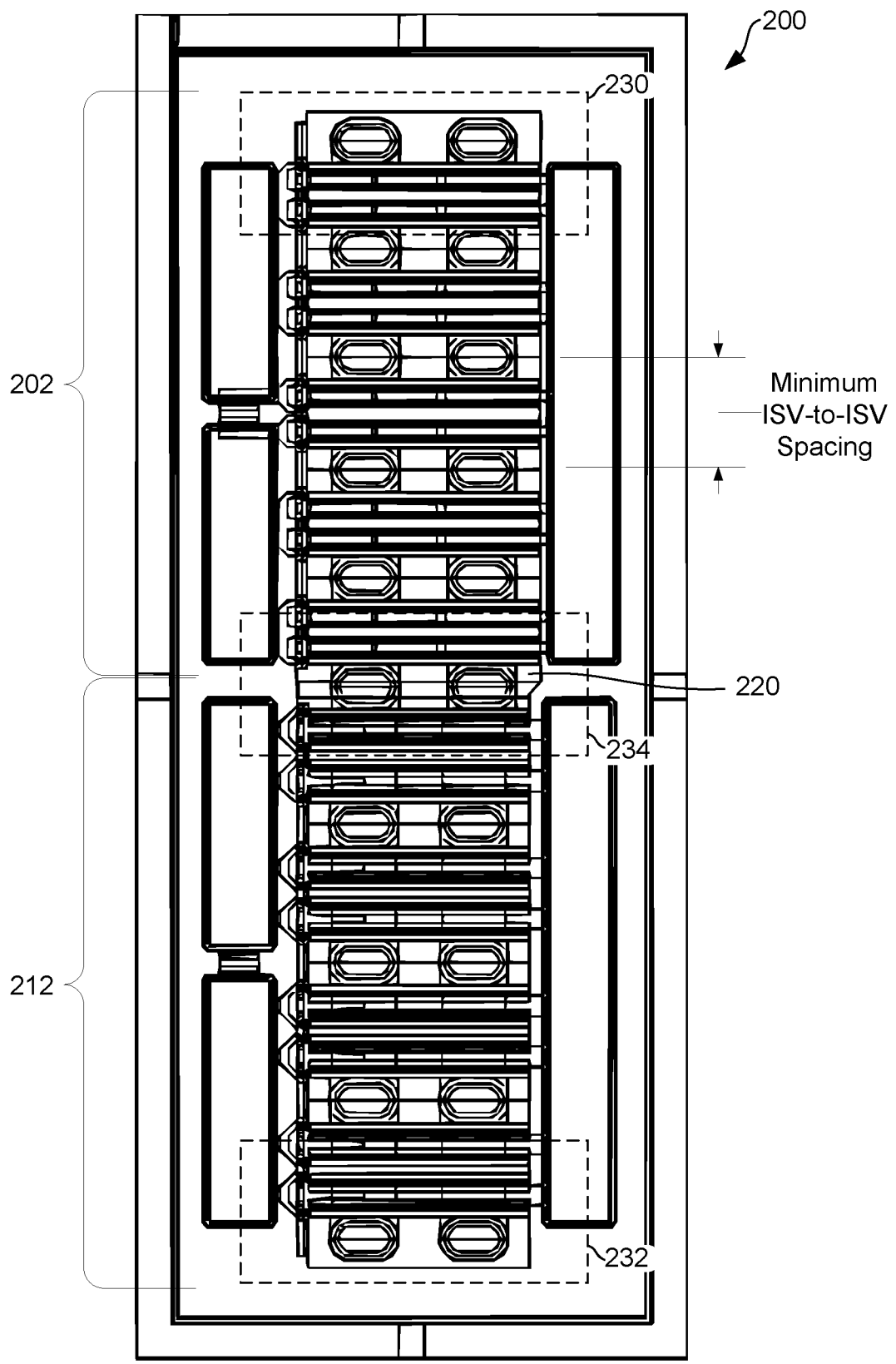
FIG. 3 illustrates a single die, including two power transistors, for the amplifier shown in FIG. 1 according various embodiments described herein.

According to the example shown in FIG. 3, the transistors 202 and 212 can be relied upon to implement the amplifier 10 shown in FIG. 1. The transistor 202 can be relied upon for the peaking amplifier 20, and the transistor 212 can be relied upon for the main amplifier 16. The integration of the transistors 202 and 212 onto the single die 200 in FIG. 3 reduces the total semiconductor area and package size as compared to the spaced-apart implementation shown in FIG. 2, resulting in cost savings. First, for a measurement in the same dimension, the die 200 in FIG. 3 is smaller than the combined size of the die 100 and the die 100 in FIG. 2 by the size of two die singulation keep-out areas. Additionally, the transistors 202 and 212 share a common feature to further reduce the size and cost of the die 100. In the example shown in FIG. 3, the transistors 202 and 212 share a terminal metal feature, particularly the source electrode metalization 220.

Along with the source electrode metalization 220, the transistors 202 and 212 also share a number of conductive in-source-via (ISV) connections from the metalization 220, on a topside of the die 200, to a metal layer ground plane on a backside of the die 200. By sharing the metalization 220 and ISVs, the size and cost of the die 200 and the transistors 202 and 212 can be reduced. Design rules for the use of ISVs require a minimum ISV-to-ISV spacing, as identified in FIG. 3. The shared use of the source electrode metalization 220 between the transistors 202 and 212, including the ISVs connected to the metalization 220, further reduces the overall size of the die 200 by the minimum ISV-to-ISV spacing. Additional aspects of the shared metalization 220 and ISVs are described below with reference to FIG. 6.

A region 230 of the transistor 202, a region of the transistor 212, and a shared region 234 among the transistors 202 and 212 are identified in FIG. 3. To identify certain aspects of the embodiments, the region 230 is described in further detail below with reference to FIG. 4. The region 232 is described in further detail below with reference to FIG. 5, and the shared region 234 is also described in further detail below with reference to FIG. 6.

Figure 4:
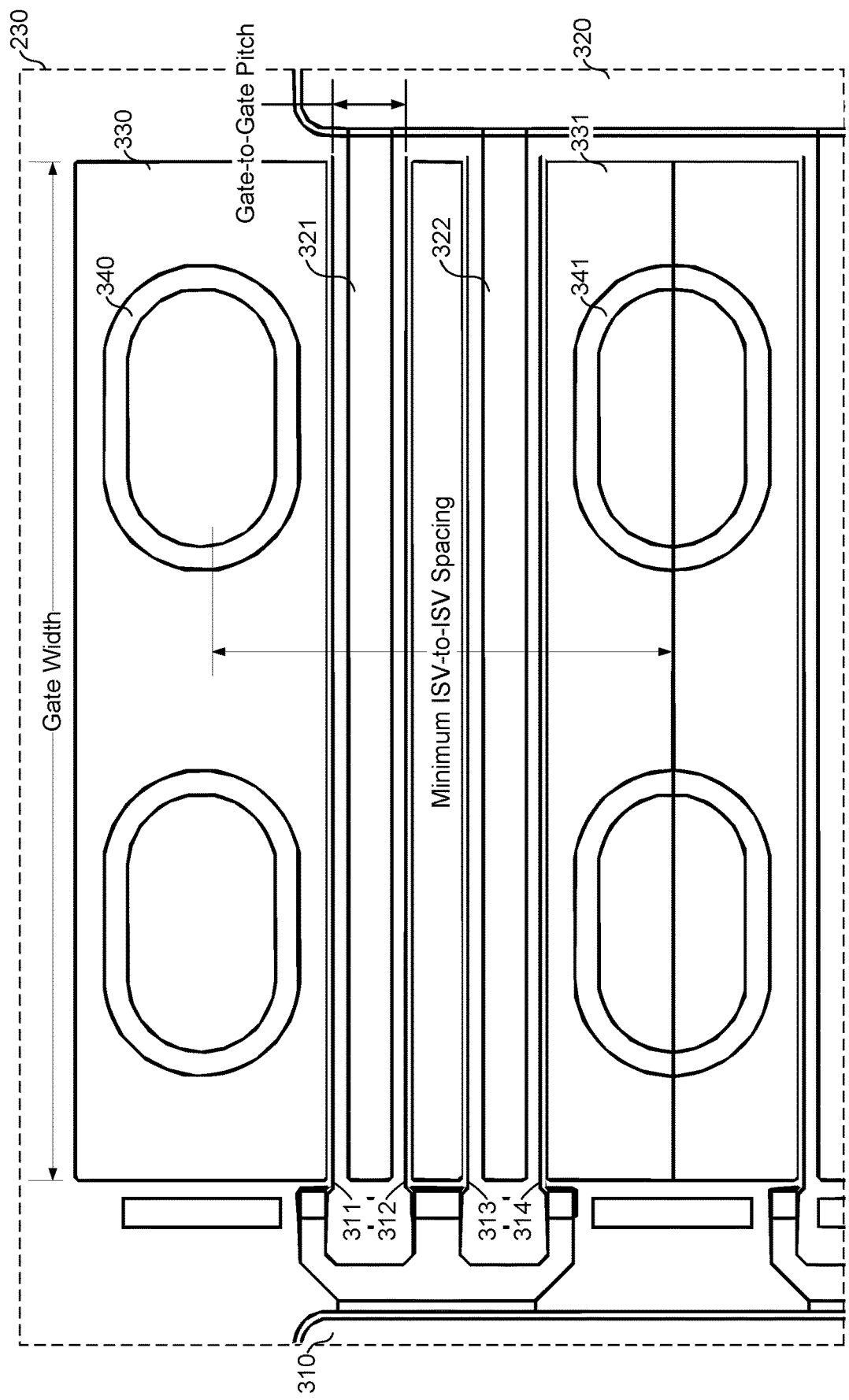
FIG. 4 illustrates a region of a first power transistor on the die shown in FIG. 3 according various embodiments described herein.

FIG. 4 illustrates a region 230 of the transistor 202 identified in FIG. 3 according various embodiments described herein. The features of the transistor 202 are not necessarily drawn to scale in FIG. 4. The transistor 202 can vary in size, shape, proportion, and other aspects as compared to that shown, while still adhering to and incorporating the concepts described herein. The transistor 202 can include other structural features not shown in FIG. 4 or, in some cases, can omit one or more of the structural features shown.

The transistor 202 is embodied as multi-finger planar FET. As shown, the transistor 202 includes a gate manifold 310 and a drain manifold 320. The gate manifold 310 and the drain manifold 320 can be embodied as separated metal layers or metalizations formed in any suitable processing step(s) on a topside of the die 200. The gate manifold 310 and the drain manifold 320 form the electrode contacts for the gate and the drain of the transistor 202, respectively. Electrically coupled to (and/or formed with) the gate manifold 310, the transistor 202 also includes a number of gate fingers 311-314, among others.

Electrically coupled to (and/or formed with) the drain manifold 320, the transistor 202 also includes a number of drain electrodes 321-322, among others. The transistor 202 also includes a number of source electrodes 330-331, among others. The source electrodes 330-331 can be embodied as metal layers or metalizations formed in any suitable processing step(s) on a topside of the die 200. As described in further detail below with reference to FIGS. 6A and 6B, the source electrodes 330-331 can be electrically coupled through the substrate upon which the transistor 202 is formed, for electrical coupling with a metal plane on a backside of the substrate, using vias 340-341. In some cases, the metal plane can be a ground plane for the transistor 202.

As shown in FIG. 4, the gate fingers 311-314 and the drain electrodes 321-322 are interdigitated among each other, between the source electrodes 330-331. Particularly, the gate finger 311 is a relatively slender metal strip or line that extends between the source electrode 330 and the drain electrode 321, and the gate finger 314 is a relatively slender metal strip or line that extends between the source electrode 331 and the drain electrode 322. The gate metal may contact the semiconductor surface directly and form a Schottky gated device, or it may be formed on a dielectric or electrically insulating material and form an insulated gate device. Other gate fingers extend similarly between other source and drain electrodes in the transistor 202. By design, current can be controlled to flow between the source electrodes 330-331 and the drain electrodes 321-322, among other source and drain electrodes in the transistor 202, based on the controlled application of electric potential on the gate manifold 310 and the gate fingers 311-314.

As noted above, the transistor 202 can be formed as a GaN power transistor in one example, capable of handling relatively high voltages and levels of current. The gate width, number of gate fingers, gate-to-gate pitch, and other structural- and layout-based aspects determine the operating characteristics of the transistor 202. The gate width and gate-to-gate pitch for the transistor 202 are identified in FIG. 4. As described below, certain characteristics of the transistor 212 vary as compared to the transistor 202.

Figure 5:
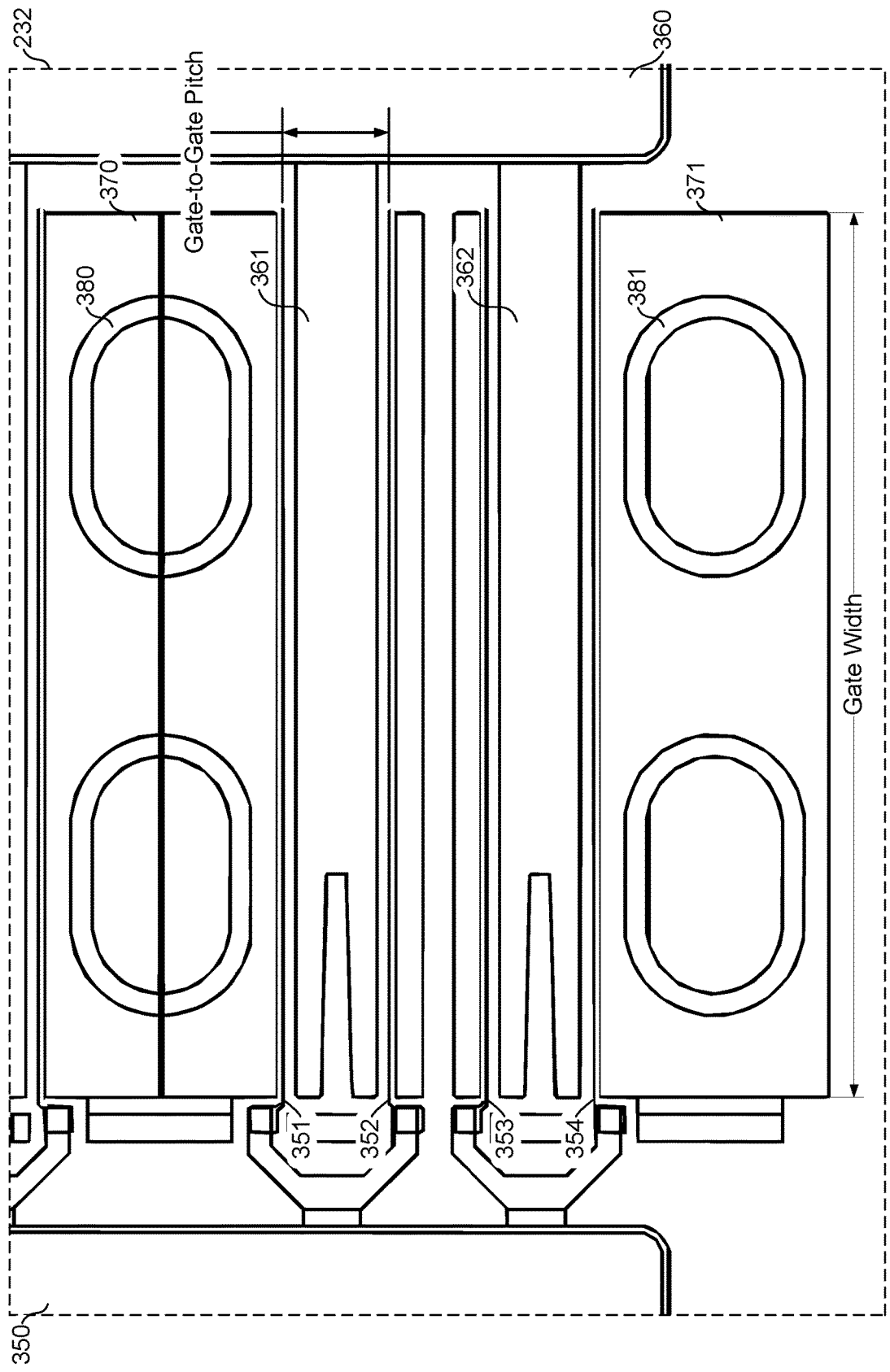
FIG. 5 illustrates a region of a second power transistor on the die shown in FIG. 3 according various embodiments described herein.

FIG. 5 illustrates a region 232 of the transistor 212 identified in FIG. 3 according various embodiments described herein. The features of the transistor 212 are not necessarily drawn to scale in FIG. 5. The transistor 212 can vary in size, shape, proportion, and other aspects as compared to that shown, while still adhering to and incorporating the concepts described herein. The transistor 212 can include other structural features not shown in FIG. 5 or, in some cases, can omit one or more of the structural features shown.

The transistor 212 is embodied as multi-finger planar FET. As shown, the transistor 212 includes a gate manifold 350 and a drain manifold 360. The gate manifold 350 and the drain manifold 360 can be embodied as separated metal layers or metalizations formed in any suitable processing step(s) on a topside of the die 200. The gate manifold 350 and the drain manifold 360 form the electrode contacts for the gate and the drain of the transistor 212, respectively.

Electrically coupled to (and/or formed with) the gate manifold 350, the transistor 212 also includes a number of gate fingers 351-354, among others. Electrically coupled to (and/or formed with) the drain manifold 360, the transistor 212 also includes a number of drain electrodes 361-362, among others. The transistor 212 also includes a number of source electrodes 370-371, among others. The source electrodes 370-371 can be embodied as metal layers or metalizations formed in any suitable processing step(s) on a topside of the die 200. As described in further detail below with reference to FIGS. 6A and 6B, the source electrodes 370-371 can be electrically coupled through the substrate upon which the transistor 212 (and the transistor 202) is formed, for electrical coupling with a metal plane on a backside of the substrate, using vias 380-381. In some cases, the metal plane can be a ground plane for the transistor 212.

As shown in FIG. 4, the gate fingers 351-354 and the drain electrodes 361-362 are interdigitated among each other, between the source electrodes 370-371. Particularly, the gate finger 351 is a relatively slender metal strip or line that extends between the source electrode 370 and the drain electrode 361, and the gate finger 354 is a relatively slender metal strip or line that extends between the source electrode 381 and the drain electrode 362. Other gate fingers extend similarly between other source and drain electrodes in the transistor 212. By design, current can be controlled to flow between the source electrodes 370-371 and the drain electrodes 361-362, among other source and drain electrodes in the transistor 212, based on the controlled application of electric potential on the gate manifold 350 and the gate fingers 351-354.

As noted above, the transistor 212 can be formed as a GaN power transistor in one example, capable of handling relatively high voltages and levels of current. The gate width, number of gate fingers, gate-to-gate pitch, and other structural- and layout-based aspects determine the operating characteristics of the transistor 212. The gate width and gate-to-gate pitch for the transistor 212 are identified in FIG. 5.

As compared to the transistor 202, the gate-to-gate pitch of the transistor 212 is larger than then transistor 202. Additionally, the gate width of the transistor 212 is smaller than the transistor 202. In other aspects, the transistor 212 can be formed to have a moderate or nominal periphery, while having a relatively larger gate-to-gate pitch than the transistor 202, to present a better thermal environment for power dissipation. The transistor 202, on the other hand, may have a relatively larger periphery, while having a relatively smaller gate-to-gate pitch, as it does not need to dissipate as much power. Despite those differences, the transistor 202 and the transistor 212 are formed and fabricated on the same substrate (e.g., semiconductor material wafers), together. The die 200 (FIG. 3) is then singulated and packaged.

The package including the die 200 shown in FIG. 3 is smaller than the package for the two, separated die 100 and 110 shown in FIG. 2. The die 200 is smaller because no singulation keep-out areas are required between the transistors 202 and 212. Further, the shared use of the source electrode metalization 220 between the transistors 202 and 212, as described below with reference to FIGS. 6A and 6B, further reduces the overall size of the die 200 by the minimum ISV-to-ISV spacing (see FIG. 4). It is also unnecessary to pick and place two separate die as part of the packaging process for the die 200, because the transistors 202 and 212 are formed together on a common substrate.

Figure 6A:
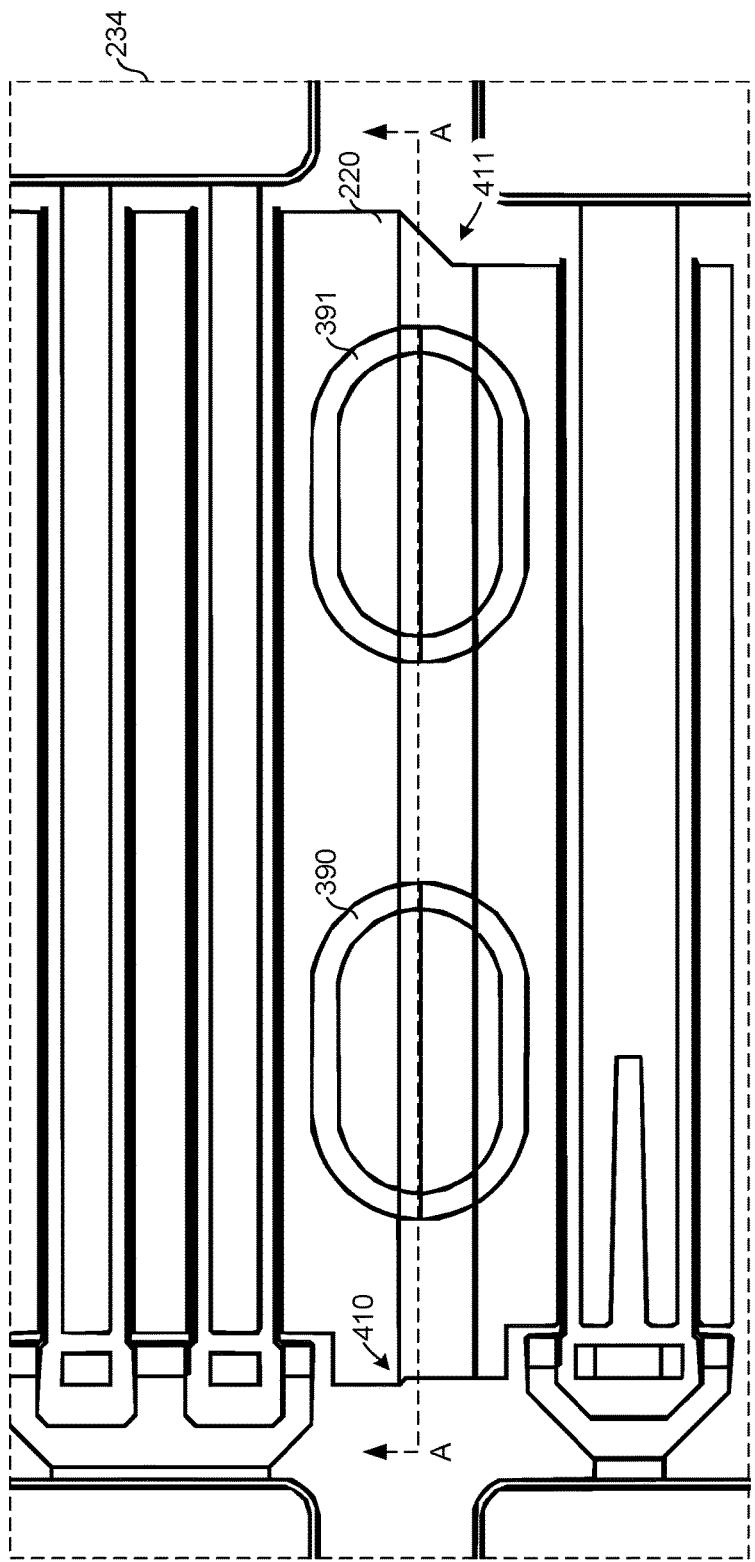
FIG. 6A illustrates a region including a terminal metal feature that is shared between the first transistor and the second transistor on the die shown in FIG. 3 according various embodiments described herein.
Figure 6B:
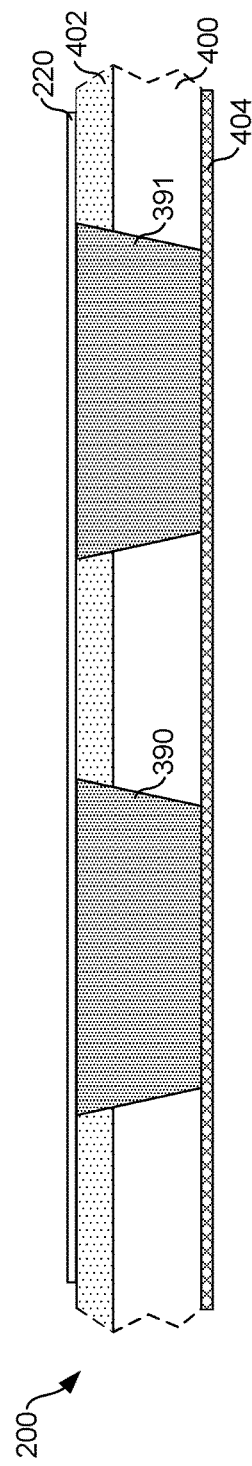
FIG. 6B illustrates the cross-sectional view A-A of the region shown in FIG. 6A according various embodiments described herein.

FIG. 6A illustrates the region 234 shown in FIG. 3, including the source electrode metalization 220, and FIG. 6B illustrates the cross-sectional view A-A of the region 234 shown in FIG. 6A according various embodiments described herein. The source electrode metalization 220 is a source electrode shared between the transistor 202 and the transistor 212. The source electrode metalization 220 can be formed in any suitable processing step(s) on a topside of the die 200. In FIG. 6A, the drain electrodes above the source electrode metalization 220 are drain electrodes of the transistor 212, and the drain electrodes below the source electrode metalization 220 are drain electrodes of the transistor 212. In that sense, the source electrode metalization 220 is a dividing or boundary layout element between the transistors 202 and 212. As noted above, the use of the shared source electrode metalization 220 between the transistors 202 and 212 reduces the overall size of the die 200 by one minimum ISV-to-ISV spacing (see FIG. 4), as compared to a case where the transistors 202 and 212 were both formed on a common substrate, but separated from each other.

Because the source electrode metalization 220 is shared between the transistors 202 and 212, the source electrodes of the transistors 202 and 212 are electrically coupled (i.e., common or shorted) together in the example shown. In that sense, the source electrode metalization 220 is an example of a shared terminal metal feature of the transistors 202 and 212. However, the concepts described herein are not limited to any particular terminal or electrode being shared between active devices. Instead, the concepts can be extended to a shared gate electrode (e.g., the gate manifolds 310 (FIG. 4) and 350 (FIG. 5) being shared), a shared drain electrode (e.g., the drain manifolds 320 (FIG. 4) and 360 (FIG. 5) being shared), or other shared features among active semiconductor devices.

The ISVs 390 and 391 are also identified in both FIGS. 6A and 6B. As shown in the cross-sectional view of FIG. 6B, the die 200 includes a substrate 400, a layer of semiconductor material 402 formed on one side over the substrate 400, and a metal ground plane 404 formed on another side under the substrate 400. The illustrations in FIGS. 6A and 6B are representative and are not necessarily drawn to scale. The features can vary in size, shape, proportion, and other aspects as compared to that shown, while still adhering to and incorporating the concepts described herein. The transistors 202 and 212 can include other structural features not shown in FIGS. 6A and 6B or, in some cases, can omit one or more of the structural features or elements shown.

Among other suitable materials, the substrate 400 can be embodied as a Silicon (Si) or Silicon-Carbide (SiC) substrate. The semiconductor material 402 can be embodied as GaN semiconductor material in one example, although other group III-Nitrides or III-V semiconductor materials can be used. Thus, the transistors 202 and 212 can be formed as GaN-on-Si transistors, GaN-on-SiC transistors, or GaN transistors formed on other substrate materials. The concepts are not limited to transistors formed using group III-V semiconductor materials, however, and the semiconductor material 402 layer can even be omitted in some cases. Referring to FIG. 6B, the ISVs 390 and 391 extend from and electrically couple the source electrode metalization 220 to the metal ground plane 404.

As shown in FIG. 6A, the source electrode metalization 220 includes transitional features 410 and 411. Particularly, the gate width of the transistor 202 is larger than the transistor 212. Thus, the source electrode metalization 220 is designed to transition in size from the larger gate width of the transistor 202 to the smaller gate width of the transistor 212. As shown in FIG. 6A, the transitional features 410 and 411 comprise metalization tapers from the larger gate width of the transistor 202 to the smaller gate width of the transistor 212. The tapers can vary in size and shape as compared to that shown in FIG. 6A. For example, the tapers can be chamfered at any angle, curved, or include any combination of curved and angled segments.

While some of the embodiments described herein are described with respect to GaN-on-Si transistors, it is understood that the embodiments described herein can also be applied to GaN-on-SiC transistors, as well as other types of transistors. In any case, the techniques and optimizations described herein offer a number of cost and size improvements, among other possible device characteristic improvements. As used herein, the phrase "gallium nitride material" or GaN semiconductor material refers to gallium nitride and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), among others. Typically, when present, arsenic and/or phosphorous are at low concentrations (e.g., less than 5 weight percent). The term "gallium nitride" or GaN semiconductor refers directly to gallium nitride, exclusive of its alloys.

The features, structures, or characteristics described above may be combined in one or more embodiments in any suitable manner, and the features discussed in the various embodiments are interchangeable, if possible. In the foregoing description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although the relative terms such as "on," "below," "upper," and "lower" may be used to describe the relative relationship of certain components, these terms are used for convenience only, for example, as a direction in examples shown in the drawings. It should be understood that if the device is turned upside down, the "upper" component described above will become a "lower" component. When a structure is "on" another structure, it is possible that the structure is integrally formed on another structure, or that the structure is "directly" disposed on another structure, or that the structure is "indirectly" disposed on the other structure through other structures.

In this specification, the terms such as "a," "an," "the," and "said" are used to indicate the presence of one or more elements and components. The terms "comprise," "include," "have," "contain," and their variants are used to be open ended, and are meant to include additional elements, components, etc., in addition to the listed elements, components, etc. unless otherwise specified. The terms "first," "second," etc. are used only as labels, rather than a limitation for a number of the objects.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. An integrated semiconductor device, comprising:
   a first transistor formed on a substrate; and
   a second transistor formed on the substrate, wherein:
   a first width of a gate finger of the first transistor is greater than a second width of a gate finger of the second transistor;
   the first transistor and the second transistor share at least one terminal metal feature to reduce a size of the integrated semiconductor device; and
   the at least one terminal metal feature is positioned between the gate finger of the first transistor and the gate finger of the second transistor.

2. The integrated semiconductor device of claim 1, wherein the at least one terminal metal feature comprises a shared source electrode metalization of the first transistor and the second transistor.

3. The integrated semiconductor device of claim 2, wherein:
   the shared source electrode metalization comprises at least one metalization taper from a size of the first width to a size of the second width.

4. The integrated semiconductor device of claim 2, further comprising:
   a metal layer ground plane on a backside of the substrate, wherein:
   the at least one terminal metal feature further comprises an in-source via for the shared source electrode metalization; and
   the in-source via electrically couples the shared source electrode metalization of the first transistor and the second transistor to the metal layer ground plane.

5. The integrated semiconductor device of claim 1, wherein:
   the first transistor comprises a number of gate fingers, a number of drain electrodes, and a number of source electrodes;
   the gate fingers, drain electrodes, and source electrodes are interdigitated among each other; and
   each drain electrode among the number of drain electrodes is positioned between two gate fingers among the number of gate fingers.

6. The integrated semiconductor device of claim 1, wherein a gate-to-gate pitch of the first transistor is smaller than the gate-to-gate pitch of the second transistor.

7. The integrated semiconductor device of claim 1, wherein the first transistor and the second transistor comprise power transistors in an amplifier.

8. The integrated semiconductor device of claim 1, wherein:
   the first transistor comprises a main power transistor in a Doherty amplifier; and
   the second transistor comprises a peak power transistor in the Doherty amplifier.

9. The integrated semiconductor device of claim 1, wherein the substrate comprises at least one of silicon or silicon carbide.

10. The integrated semiconductor device of claim 9, further comprising:
    a gallium nitride semiconductor material layer formed over the substrate.

11. The integrated semiconductor device of claim 1, wherein the first transistor and the second transistor comprise gallium nitride semiconductor material power transistors.

12. An integrated semiconductor device, comprising:
    a first active device formed on a substrate; and
    a second active device formed on the substrate, wherein:
    a first width of an electrode of the first active device is greater than a second width of an electrode of the second active device;
    the first active device and the second active device share at least one terminal metal feature to reduce a size of the integrated semiconductor device; and the at least one terminal metal feature is positioned between the electrode of the first active device and the electrode of the second active device.

13. The integrated semiconductor device of claim 12, wherein the at least one terminal metal feature comprises a shared electrode metalization of the first active device and the second active device.

14. The integrated semiconductor device of claim 13, wherein:
the shared electrode metalization comprises at least one metalization taper from a size of the first width to a size of the second width.

15. The integrated semiconductor device of claim 13, further comprising:
a metal layer ground plane on a backside of the substrate, wherein:
the at least one terminal metal feature further comprises an in-electrode via for the shared electrode metalization; and
the in-electrode via electrically couples the shared electrode metalization of the first active device and the second active device to the metal layer ground plane.

16. The integrated semiconductor device of claim 12, wherein:
the first active device comprises a number of gate fingers, a number of drain electrodes, and a number of source electrodes;
the gate fingers, drain electrodes, and source electrodes are interdigitated among each other; and
each drain electrode among the number of drain electrodes is positioned between two gate fingers among the number of gate fingers.

17. The integrated semiconductor device of claim 12, wherein a gate-to-gate pitch of the first active device is smaller than the gate-to-gate pitch of the second active device.

18. The integrated semiconductor device of claim 12, wherein:
the first active device comprises a main power transistor in a Doherty amplifier; and
the second active device comprises a peak power transistor in the Doherty amplifier.

19. The integrated semiconductor device of claim 12, wherein the substrate comprises at least one of silicon or silicon-carbide.

20. The integrated semiconductor device of claim 12, wherein the first active device and the second active device comprise gallium nitride semiconductor material power transistors.

* * * * *